US009142485B2

(12) United States Patent
Grasset

(10) Patent No.: US 9,142,485 B2
(45) Date of Patent: Sep. 22, 2015

(54) CONTACTLESS OBJECT WITH INTEGRATED CIRCUIT CONNECTED TO CIRCUIT TERMINALS BY CAPACITIVE COUPLING

(76) Inventor: Yannick Grasset, Vallauris (FR)

( * ) Notice: Subject to any disclaimer, the term of this patent is extended or adjusted under 35 U.S.C. 154(b) by 454 days.

(21) Appl. No.: 12/867,405

(22) PCT Filed: Feb. 13, 2009

(86) PCT No.: PCT/FR2009/000163
§ 371 (c)(1),
(2), (4) Date: Feb. 23, 2011

(87) PCT Pub. No.: WO2009/115673
PCT Pub. Date: Sep. 24, 2009

(65) Prior Publication Data
US 2011/0139878 A1 Jun. 16, 2011

(30) Foreign Application Priority Data

Feb. 13, 2008 (FR) ..................................... 08 00775

(51) Int. Cl.
*G06K 19/06* (2006.01)
*H01L 23/48* (2006.01)
(52) U.S. Cl.
CPC ......... *H01L 23/48* (2013.01); *H01L 2924/0002* (2013.01); *H01L 2924/3011* (2013.01); *Y10T 29/49002* (2013.01)
(58) Field of Classification Search
CPC . H01L 23/48; H01L 23/3157; H01L 23/3171; H01L 2224/0348; H01L 2224/1148; H01L 2224/2748; G06K 19/067; G06K 19/07; G06K 19/0723; G06K 19/077; G06K 19/07745; G06K 19/07756

USPC .................................................. 235/487, 492
See application file for complete search history.

(56) References Cited

U.S. PATENT DOCUMENTS 5,706,015 A * 1/1998 Chen et al. ............. 343/700 MS
5,765,277 A 6/1998 Jin et al.
(Continued)

FOREIGN PATENT DOCUMENTS

DE 10117929 A1 8/2002
DE 10133588 A1 9/2002
(Continued)

OTHER PUBLICATIONS

International Search Report of PCT/FR2009/000163, Mailing Date of Oct. 2, 2009.
(Continued)

*Primary Examiner* — Paultep Savusdiphol
(74) *Attorney, Agent, or Firm* — Westerman, Hattori, Daniels & Adrian, LLP

(57) ABSTRACT

The invention relates to integrated circuits (1) that comprise, on the active surface thereof, a first dielectric layer defining a passivation layer (6) and contact pads (5) flush through openings (7) in said passivation layer, wherein said integrated circuits are to be incorporated in contactless portable objects (10) for connection by capacitive coupling to the terminals (13) of an antenna-forming circuit (11) mounted on a substrate (12) of said object. The invention also relates to contactless portable objects including such circuits. The invention is characterized in that the capacitive coupling is carried out using connection plates (8) of the integrated circuits, positioned at the surface of the passivation layer and electrically connected to the contact pads. The invention can particularly be used in UHF RFID objects.

20 Claims, 3 Drawing Sheets

(56) References Cited

U.S. PATENT DOCUMENTS

| | | | |
|---|---|---|---|
| 5,786,979 A * | 7/1998 | Douglass | 361/328 |
| 6,043,144 A * | 3/2000 | Kuo | 438/612 |
| 6,259,158 B1 | 7/2001 | Usami | |
| 6,376,782 B1 * | 4/2002 | Kimura et al. | 174/267 |
| 6,421,013 B1 | 7/2002 | Chung | |
| 6,700,796 B2 * | 3/2004 | Detcheverry et al. | 361/792 |
| 6,900,536 B1 * | 5/2005 | Derbenwick et al. | 257/724 |
| 7,167,608 B2 * | 1/2007 | Ogawa | 385/14 |
| 7,224,280 B2 * | 5/2007 | Ferguson et al. | 340/572.7 |
| 7,335,556 B2 | 2/2008 | Yamaguchi et al. | |
| 7,452,748 B1 * | 11/2008 | Craig et al. | 438/108 |
| 7,551,141 B1 * | 6/2009 | Hadley et al. | 343/700 MS |
| 7,612,676 B2 * | 11/2009 | Yuen et al. | 340/572.7 |
| 7,663,567 B2 | 2/2010 | Hilgers | |
| 7,687,327 B2 * | 3/2010 | Cleeves et al. | 438/149 |
| 7,701,352 B2 | 4/2010 | Forster | |
| 7,988,059 B2 | 8/2011 | Grasset | |
| 7,998,059 B2 | 8/2011 | Fujimori | |
| 8,072,333 B2 * | 12/2011 | Ferguson et al. | 340/572.7 |
| 2003/0042572 A1 * | 3/2003 | Detcheverry et al. | 257/533 |
| 2005/0001785 A1 | 1/2005 | Ferguson et al. | |
| 2005/0045914 A1 | 3/2005 | Agranat et al. | |
| 2006/0057763 A1 | 3/2006 | Teo et al. | |
| 2006/0063323 A1 | 3/2006 | Munn | |
| 2006/0261950 A1 | 11/2006 | Arneson et al. | |
| 2007/0007342 A1 * | 1/2007 | Cleeves et al. | 235/435 |
| 2007/0056683 A1 | 3/2007 | Manes et al. | |
| 2007/0216534 A1 * | 9/2007 | Ferguson et al. | 340/572.7 |
| 2007/0284759 A1 | 12/2007 | Suguro et al. | |
| 2008/0061981 A1 | 3/2008 | Munn | |
| 2008/0129511 A1 * | 6/2008 | Yuen et al. | 340/572.7 |
| 2008/0138971 A1 | 6/2008 | Yamaguchi et al. | |
| 2008/0316135 A1 | 12/2008 | Hilgers | |
| 2009/0014527 A1 | 1/2009 | Grasset et al. | |
| 2009/0128332 A1 * | 5/2009 | Lu | 340/572.1 |
| 2009/0278690 A1 * | 11/2009 | Degani | 340/572.7 |
| 2010/0040449 A1 | 2/2010 | Blessing et al. | |
| 2010/0065647 A1 | 3/2010 | Ritamaki et al. | |
| 2010/0224959 A1 * | 9/2010 | Scherabon et al. | 257/532 |
| 2010/0230498 A1 * | 9/2010 | Atherton | 235/492 |
| 2011/0171783 A1 | 7/2011 | Grasset | |

FOREIGN PATENT DOCUMENTS

| | | |
|---|---|---|
| EP | 1742171 A1 | 6/2007 |
| FR | 2894714 A1 | 6/2007 |
| WO | 97/24740 A1 | 7/1997 |
| WO | 2006/009934 A1 | 1/2006 |
| WO | 2008/092798 A1 | 8/2008 |
| WO | 2009/010649 A1 | 1/2009 |
| WO | 2010/029233 A1 | 3/2010 |

OTHER PUBLICATIONS

International Search Report of PCT/FR/2009/001091 (WO2010/029233A1) cited in co-pending U.S. Appl. No. 13/063,629.

Office Action dated Dec. 23, 2013 (13 pages) in co-pending U.S. Appl. No. 13/389,224.

Office Action dated Mar. 29, 2013 (9 pages) in co-pending U.S. Appl. No. 13/389,224.

* cited by examiner

CONTACTLESS OBJECT WITH INTEGRATED CIRCUIT CONNECTED TO CIRCUIT TERMINALS BY CAPACITIVE COUPLING

The invention relates to contactless portable objects comprising integrated circuits, as well as processes for producing these contactless objects. It relates more specifically to objects of which the integrated circuits comprise, on their active face, a first dielectric layer forming a passivation layer and connection pads flush with openings of said passivation layer, for connection, by capacitive coupling, to the terminals of an antenna circuit mounted on a substrate of said objects.

The contactless portable objects to which this invention relates are objects with a card format, called smart cards, having a contactless mode of operation, or objects with various formats, intended in particular for radiofrequency identification (RFID), for example by replacing bar codes. These latter objects with various formats are thus commonly called electronic tags or inlays.

Such contactless portable objects of the prior art comprise, on the one hand, an integrated circuit and, on the other hand, an antenna conductor circuit. The terminals of the antenna circuit are connected to the integrated circuit, for transmission and reception of radiofrequency signals between a remote reader and said circuit.

The connection of the contact pads of the integrated circuit with the terminals of an antenna conductor circuit is performed according to various methods. Generally, it is performed by using the so-called wire bonding method. In this case, the contact pads of the integrated circuit are connected to the contact terminals of the antenna conductor circuit by connection wires, generally made of gold. Two welding operations are then necessary for each contact. A first, on the connection pads of the integrated circuit, and a second, on the terminals of the antenna circuit. The connection can alternately be performed by using a method for connection by means of bumps. In this case, a ball bond, generally made of gold, is deposited on the contact pads of the integrated circuit. It is then turned over ("flip-chip") for connection to the terminals of the antenna conductor circuit.

The methods above have the disadvantage of requiring low positioning tolerance of the connection means, i.e. in practice, on the order of several tens of microns. Indeed, in RFID applications in particular, and, more specifically, in RFID applications functioning at Ultra-High Frequency (UHF), in practice starting at 400 MHz, the dimensions of the integrated circuit, like those of the contact terminals of the antenna circuit, are significantly reduced, by several tens of microns. The surface of the contact pads of this circuit is even smaller, since it is generally in the form of a square with sides smaller than 100 µm. Due to this low positioning tolerance, the production rates are reduced. Also, the aforementioned methods known from the prior art are not suitable for mass production of contactless objects at low cost.

For this reason, a new method has been envisaged. This method is disclosed in the patent document published under number FR 2894714 A1. In this method, the dimensions of the contact pads of the integrated circuit are considerably larger and the connection between said contact pads and the contact terminals of the antenna is performed, not by ohmic contact, but by capacitive coupling. The tolerance to the positioning of the circuit for the connection to the terminals of the antenna circuit is then substantially improved.

Nevertheless, this latter method has different disadvantages.

First, the production of said contact pads requires deviation from the design rules of integrated circuits, which must be obtained from the founders in order to authorize a modification of the dimensions of the contact pads. Indeed, these design rules impose overall metal density limits for the integrated circuit and local metal density limits for each metallization layer of said circuits. By considerably increasing the dimensions of the contact pads of the last metallization layer of the circuit, these rules are no longer observed, not only locally, but also sometimes overall. Moreover, the quasi-exclusive use of the last metal layer of the integrated circuit for large contact pads requires a different positioning of the interconnections normally present on this last layer, and, therefore, a new design with different masks. Finally, this last layer can no longer be used. It is no longer possible to simply include intellectual property blocks (IP blocks) using connections on the last metal layer. Furthermore, in consideration of the large dimensions of the contact pads, parasitic capacitances are generated in the integrated circuit, which are capable of causing malfunctions in the circuit. This is unacceptable.

With regard to the design rules of integrated circuits, it should be noted that there is a minimum number of contact pads for which said design rules are observed. However, in the aforementioned patent FR 2894714 A1, the contact pads are not connection plates. A new deviation from the design rules is therefore necessary. Finally, in the aforementioned patent, the integrated circuit must be designed with these connection pads making it unsuitable for any other packaging mode. The subject matter disclosed in this prior patent therefore is not compatible with all integrated circuits.

In consideration of the above, an objective technical problem to be solved by the invention is that of producing, at lower costs, a portable object comprising an integrated circuit, as well as a process for producing this portable object, which overcomes the aforementioned disadvantages of the prior art, and which, in particular, is compatible with all integrated circuits produced, does not require deviation from integrated circuit design rules, enables positioning of IP blocks freely using the last metal layer, and limits the existence of parasitic capacitances in the circuit, all while having significant positioning tolerance, for the mass production of contactless objects at low cost, with high production rates.

The solution provided by the invention to this stated problem first relates a contactless portable object including, on the one hand, an integrated circuit comprising, on its active face, a first dielectric layer forming a passivation layer and contact pads flush with openings of said passivation layer, and, on the other hand, terminals of an antenna circuit 11 borne by a substrate 12, characterized in that said circuit also comprises connection plates connected to said terminals of the antenna circuit by capacitive coupling, in which said connection plates are positioned at the surface of the passivation layer and electrically connected to the contact pads.

It relates secondly to an integrated circuit for producing a contactless portable object as described above.

It relates thirdly to a process for producing a contactless object as described above, characterized in that it comprises the following steps, according to which:

integrated circuit wafers having a passivation layer equipped with openings with which contact pads are flush are provided;

connection plates are positioned at the surface of the passivation layer, so that said plates are electrically connected to the contact pads; and the integrated circuits are positioned on the substrates bearing an antenna circuit so that the connection plates are arranged opposite terminals of said antenna circuit.

Thus, unlike the teaching of the prior art contained in the aforementioned patent document FR 2894714 A1, the contact plates, which produce the capacitive coupling, are positioned at the surface of the passivation layer. It is therefore unnecessary to modify the integrated circuit production designs. A post-treatment of the integrated circuits is sufficient. The costs for producing contactless objects are considerably reduced. The parasitic capacitances due to the presence of plates are limited because the passivation layer distances said plates from the various connections of the internal electronic functions of the integrated circuit. The same is true of the reproducibility of disturbances due to assembly variations of the circuit on its substrate.

The invention can be better understood in view of the following description, and in reference to the appended drawings, in which.

Figure 7A:
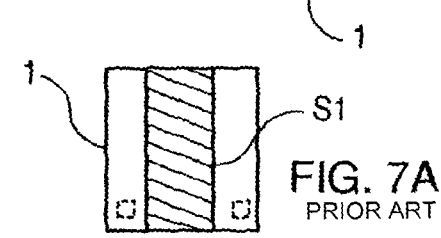
Figure 7B:
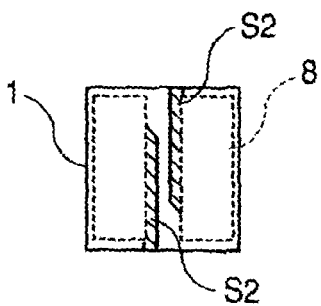

FIGS. 7A and 7B compare the zones at the origin of the interfering assembly variations, in the case of the prior art and in the case of the invention, respectively.

Figure 1:
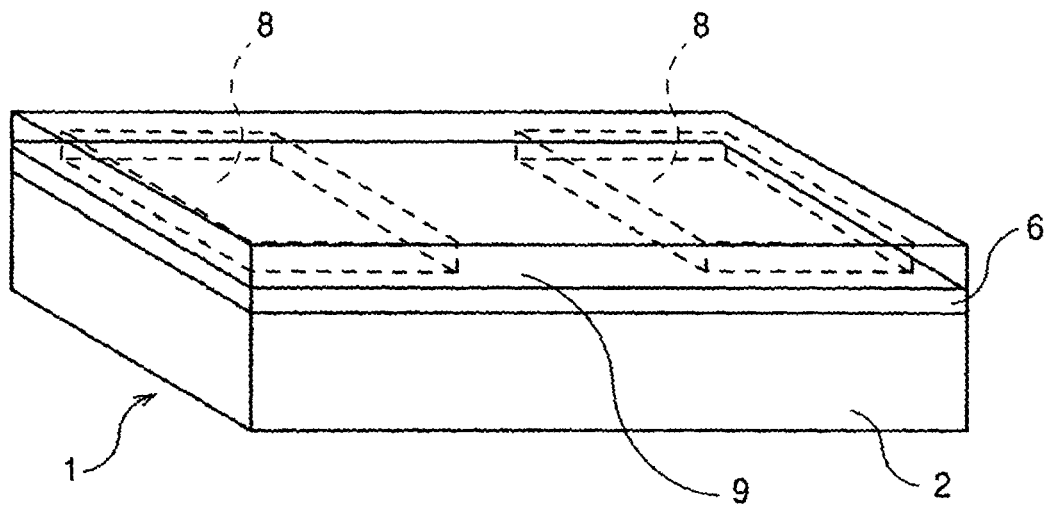
FIG. 1 shows, in perspective, an integrated circuit according to the invention.
Figure 2:
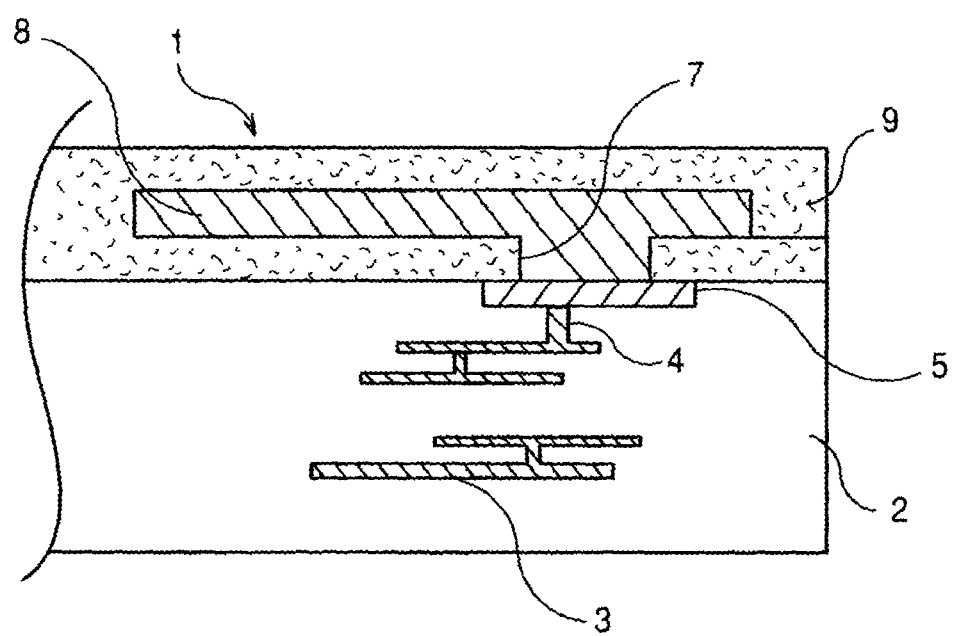
FIG. 2 shows, in a transverse cross-section, a portion of an integrated circuit according to the invention bearing connection plates.

The integrated circuit 1 shown in FIGS. 1 and 2 is in the form of a rectangular parallelepiped with a thickness of more or less one hundred microns, and a width and length of several hundred microns, for example 900 μm long and 600 μm wide. This circuit 1 comprises a silicon substrate 2 consisting of a superimposition of layers, for example, ten, in which each layer includes integrated circuits 3, and the circuits of two superimposed layers are interconnected by means of via holes 4. The last metal layer of the integrated circuit according to the invention, which defines its active face, has two or more contact pads 5, for example, three, four, six or eight. These pads 5 have, in an example, a surface on the order of 80 μm×80 μm, much smaller than the surface of the integrated circuit 1. The last metal layer is covered with a dielectric layer: the passivation layer 6. This passivation layer 6, for example made of insulating silicon, has a substantially constant thickness of between 1 and 7 μm, for example on the order of 3 μm on average. It comprises openings 7 located opposite the contact pads 5, so as to enable access to said pads 5 for the connection of same. The contact pads 5 are flush with these openings 7.

According to the invention, the integrated circuit 1 also comprises connection plates 8. These plates 8 are positioned at the surface of the passivation layer 6. They are electrically connected to the contact pads 5 of the integrated circuit, through openings 7. The dimensions of the connection plates 8 are much greater than those of the contact pads 5, at least with regard to the width and the length of these plates 8. For example, for an integrated circuit of which the dimensions of the active face, advantageously rectangular, are 900 μm long and 600 μm wide, and which have a preferred length-width ratio greater than or equal to 1.25, the dimensions of each connection plate are 200 μm×500 μm. Owing to this size difference, the positioning constraints as well as the orientation constraints of the integrated circuits are relaxed during the operation of packaging contactless objects incorporating the integrated circuits. In practice, when the integrated circuit comprises two connection plates 8, the surface of each plate is on the order of one-third the total surface of the integrated circuit. The thickness of the plates 8 is relatively low, on the order of several microns, for example 6 μm.

The optimal distance separating the plates is between 100 μm and 300 μm. In the example above, the plates are separated by around 250 μm.

In practice, the surface of the plates is advantageously chosen so as to optimize the constraints and costs of production of contactless objects and, in particular, of the antenna circuit of said objects. Indeed, the capacitances formed by the plates and the antenna terminals are directly proportional to the surface of said plates. Therefore, it is possible to modify said capacitance values in order to optimize the antenna circuit. It should also be noted that it is possible to modify the impedance presented to the antenna by adjusting only the dimensions of said plates. This is a substantial advantage over the prior art. Indeed, according to the prior art, the impedance presented to the antenna can be modified only by overhauling, at least partially, the internal structure of the integrated circuit. Such an overhaul requires significant developments and considerable time, for example around one year.

The connection plates 8 are at least partially covered by a dielectric layer 9 consisting, like the passivation layer, of silicon. Advantageously, this layer 9 entirely covers the plates 8 and the passivation layer 6. This enables better protection from electrostatic shock (ESD), which are the source of many integrated circuit failures. The thickness of this dielectric layer 9 is substantially constant, and in one example is on the order of 10 μm.

The invention can preferably be applied to RFID UHF circuits with a frequency above 400 MHz, in particular 433 MHz, 800 to 900 MHz and beyond the GHz, with the active face of the latter having a surface of around 0.5 mm$^2$, i.e. for example, 625 μm×800 μm. To produce a capacitive connection according to the invention, the addition of additional interface for the capacitive connection can be justified only for connection plates of which the surface (length×width) is at least four times greater than the surface (length×width) of the original contact pads, i.e. at least 200 μm×200 μm. To preserve the positioning flexibility due to the relaxed mechanical tolerances for the assembly, it is necessary to consider that, in the case of two contact plates, each of the plates can cover at most only two-fifths of the active face of the integrated circuit, i.e. in our case 250 μm×800 μm. With an average thickness of the insulating layer of 3 μm for a relative permittivity of 4, and a reference permittivity (for the vacuum Epsilon$^o$=8.85. 10$^{12}$ F/m), this makes it possible to produce a nominal capacitance for each connection plate on the order of 500 fF to 2.4 pF.

It should be noted that, by adding, in an equivalent electric circuit, a series capacitance so that it consists of the connection plates above, it is possible to produce antennas with or without a test short circuit (direct current). Consequently, the antenna design and optimization rules are made more flexible.

The contactless portable objects according to the invention are standardized objects that can have any format. For example, they are in a card format, or in more restricted formats and constitute RFID tags. In some cases, the format of the contactless objects of the invention is larger than a card.

This is the case, for example, of so-called electronic wallets. The RFID objects most specifically envisaged by the present invention are RFID-UHF objects satisfying standards EPC Class 1 Gen II or ISO 18000-6C.

Figure 3:
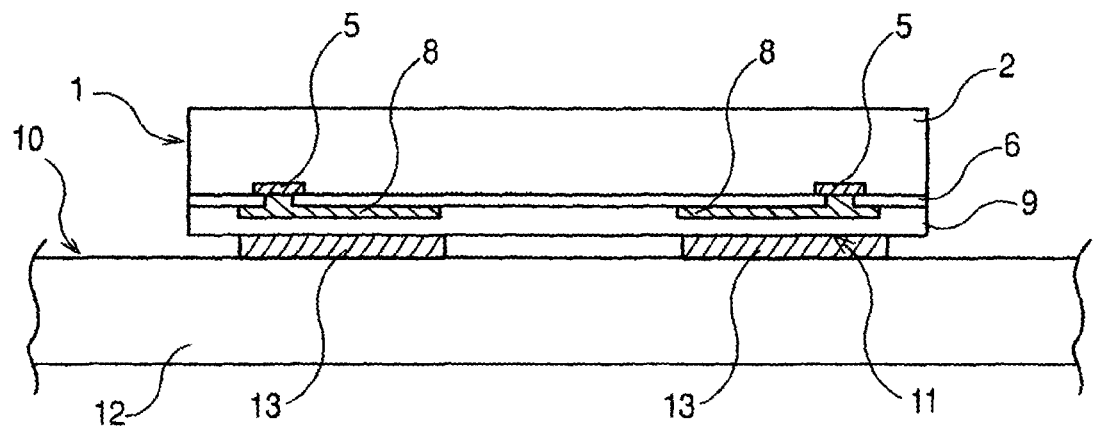
FIG. 3 shows, in a transverse cross-section, a portion of a contactless object according to the invention.

As more specifically shown in FIG. 3, these portable objects 10 comprise an integrated circuit 1 as described above, as well as a second circuit: the conductor circuit forming an antenna 11. The antenna-forming circuit 11 is, for example, printed on the surface of a dielectric substrate 12 of the object, in particular by screen printing, flexography or gravure, offset or by inkjet. The conductive ink used is preferably a polymer ink loaded with conductive elements such as silver, copper or carbon. In another example, the antenna-forming circuit 11 consists of a stamped metal strip bonded to the surface of the substrate 12, or even a coiled wire. The substrate 12 is, for example, a substrate made of a flexible material. It will then be paper or plastic. In another example, the substrate 12 is a substrate made of a rigid material. It is then hard plastic or resin. The antenna-forming circuit 11 defines a track on its substrate 12 of which the terminal ends constitute connection terminals 13 intended to be connected to the connection plates 8 of the integrated circuit by capacitive coupling.

Indeed, in the contactless portable objects 10 according to the invention, the connection between the connection plates 8 of the integrated circuit 1 and the connection terminals 13 of the antenna 11 is a capacitive connection, with the capacitance being formed between said plates 8 and said terminals 13 of the antenna-forming circuit, separated by the dielectric layer 9.

Figure 4:
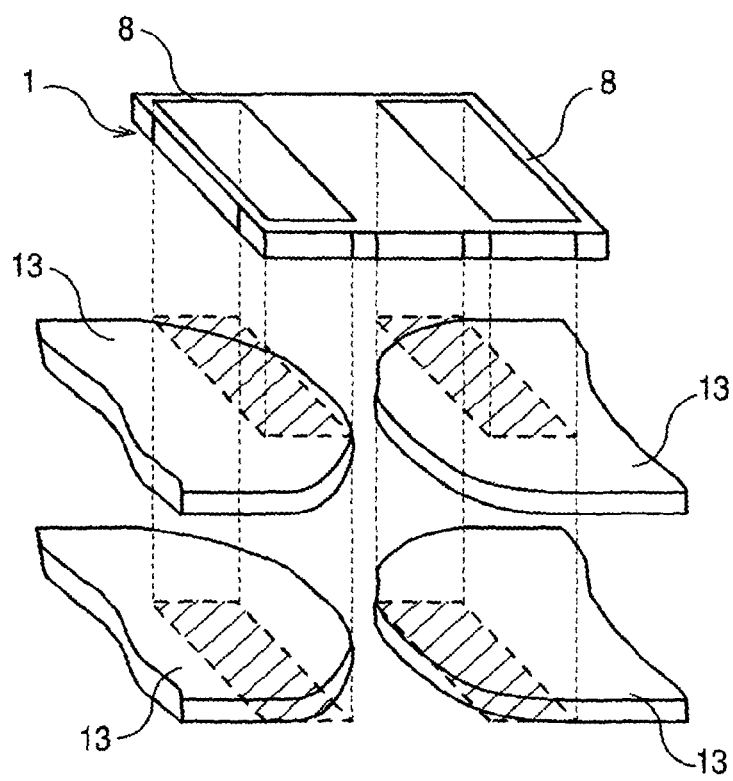
FIG. 4 shows, in perspective, the positioning tolerance of the integrated circuit according to the invention.

As shown in FIG. 4, the coupling capacitance(s) are produced by placing the plates 8 and the terminals 13 opposite one another.

When there is an internal connection capacitance in the integrated circuit 1, a new optimization of the assembly is obtained owing to a further increased positioning tolerance. Indeed, if the coupling capacitance has a larger value than the internal capacitance of the integrated circuit 1, it is necessary to choose, for obvious production reasons, a positioning accepting an error of more or less 20% of the plates 8. Owing to the invention, the positioning of the integrated circuit 1 on the substrate 12 bearing the antenna-forming circuit 11 accepts a certain tolerance. Indeed, two capacitances C1 and C2, arranged in series in a circuit, are equivalent to a capacitance $CE=(C1\times C2)/(C1+C2)$. If the capacitance C2 is greater than C1, which is the case in the assembly of the invention, then the equivalent capacitance CE tends toward a value equal to C1. In other words, when two capacitances of different values are arranged in series, the value of the capacitance of the circuit thus formed is close to the value of the capacitance with a lower value in said circuit. For example, if the coupling capacitance C2 is equal to five times the internal capacitance C1, then the equivalent capacitance CE is equal to $5/6\times C1$. If C2 increases by 20%, i.e. $C2=6\times C1$, then $CE=6/7\times C1$, which gives a CE dispersion of 2.8%. Similarly, if this capacitance C2 loses 20% and goes to four times C1, then $CE=4/5$ and there is a dispersion of 4%. In other words, 20% error on the nominal value of the coupling capacitance due to a positioning error of 20% of the conductive surfaces opposite one another causes only a variation of several percent in the capacitance of the circuit. The positioning tolerance is further increased according to the invention. It should also be noted that the aforementioned values of 2.8% and 4% correspond to acceptable dispersions in the semiconductor industry.

Figure 5A:
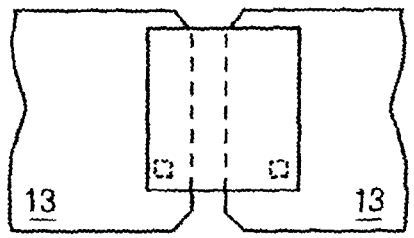
FIGS. 5A and 5B show, from a top view, the extreme tolerated variations capable of occurring in the assembly of an integrated circuit, at the terminals of an antenna circuit according to the prior art.
Figure 5A:
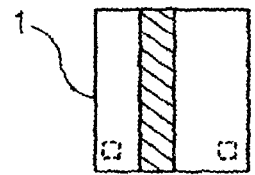
Figure 5B:
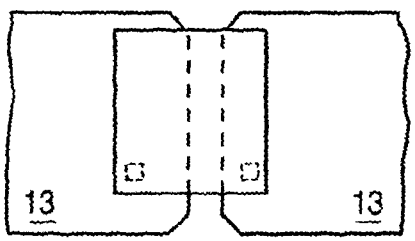
Figure 5B:
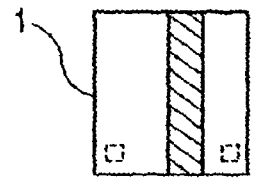
Figure 6A:
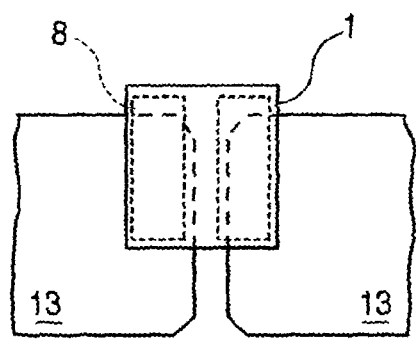
FIGS. 6A and 6B show, also in a top view, these same variations, in the case of the invention.
Figure 6A:
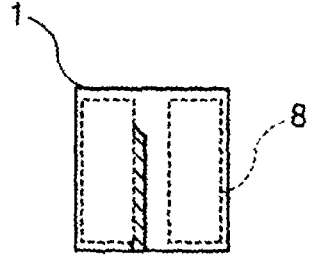
Figure 6B:
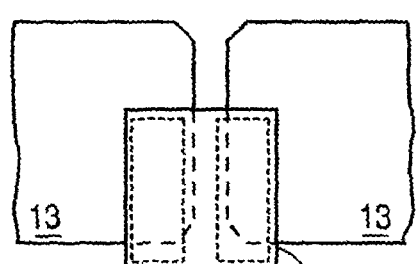
Figure 6B:
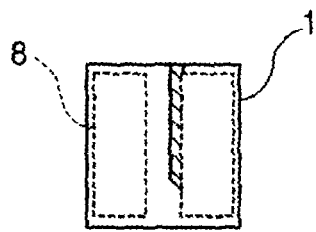

In addition, as shown in FIGS. 5A, 5B, 6A, 6B, 7A and 7B, the connection plates 8 form a shield, which ensures good reproducibility of the assembly disturbances. Indeed, according to the prior art, the integrated circuit can be mounted with a right offset (FIG. 5A) or a left offset (FIG. 5B). The disturbances are not reproduced in the same way, according to the assembly offsets. The S1 disturbance variation zone in the case of an assembly according to the prior art is shown in FIG. 7A. This zone is large and the functioning of the portable object must therefore support significant offsets in the reproducibility of disturbances, in an assembly according to the prior art. By contrast, with regard to the invention, this zone S2, which is shown in FIG. 7B, is limited. Indeed, as shown in FIGS. 6A and 6B, the zones of in which there is no conductor, during right-offset (FIG. 6B) or left-offset (FIG. 6A) assemblies, are limited at the surface. Good reproducibility of assembly disturbances is thus ensured according to the invention.

Of course, the performance of the contactless objects according to the invention is improved, in consideration of the fact that the plates are positioned not in the last metal layer of the integrated circuit, but at the upper surface of the passivation layer. Therefore, the plates are distanced from the internal circuits of the integrated circuit. The effect is thus immediate: the reduction in the parasitic capacitances leads to improved performance in functions working with signals capable of being subjected to capacitive coupling with the plates.

It should be noted that, in other alternative embodiments of the invention, the substrate is a strap, for example, described in standard JEDEC-MO283, equipped with antenna terminals and intended to be incorporated with a second substrate, which second substrate comprises an antenna-forming circuit. In other alternatives, the antenna circuit is a loopback circuit, i.e. a circuit equipped with a closed loop, for example, intended for near-field communication. The presence of capacitances at the terminals of the antenna circuit allows for the possibility of implementing such loopback circuits, in particular for circuits that are not in principle compatible with such a closed-loop antenna.

To produce the integrated circuits according to the invention, conventional methods are used to produce masks defining the circuits and used to produce wafers by means of the photolithography technique. The wafers comprise some tens of thousands of integrated circuits. As indicated above, unlike the prior art disclosed in patent document FR 2894714 A1, it is not necessary, in order to produce the integrated circuits according to the invention, to modify the drawings of the integrated circuits borne by the wafers and, in particular, the drawings relating to the last metal layer of the integrated circuits bearing contact pads. Indeed, this layer remains intact. The same is true of the passivation layer and the openings formed therein. It is thus possible to include all IP blocks, without any design restrictions. The semiconductor process is standard. The wafers delivered by the founders to the card embedders or RFID object manufacturers are thus unchanged. Unlike the aforementioned patent, there are no additional costs associated with the production of wafers.

However, to produce the integrated circuits according to the invention, the wafers must be subjected to a post-treatment.

This post-treatment includes the following steps, according to which the connection plates are positioned at the surface of the passivation layer of the integrated circuits of the wafers. These contact plates are, for example, screen printed at the surface of the passivation layer. They comprise a first portion located in the openings and a second portion on the passivation layer.

It also includes a step according to which the connection plates are covered, at least partially, with a dielectric layer.

Once the wafers have been prepared and then back-ground, at the end of this step, their thickness is reduced to around 100 μm by comparison with an initial thickness of around 600 μm for simpler integration. Then, the integrated circuits are cut (sawing step) and the entire wafer is positioned on a special plastic adhesive (blue tape), as usually performed in the semiconductor industry. Then, the integrated circuits are positioned one-by-one on the substrates of the antenna-forming circuit. The plates of the integrated circuit are placed opposite the terminals of the antenna-forming circuit. Adhesive material can be deposited between the connection terminals of the antenna-forming circuit before the integrated circuit is placed on the substrate. Once the adhesive material has been deposited, the circuit is positioned on the support so that the metal plates of the chip are opposite the connection terminals of the antenna-forming circuit. Under exerted pressure, the adhesive spreads and covers the entire surface of the chip, between the connection terminals of the antenna-forming circuit. A capacitive connection is thus produced between each metal plate and each connection terminal that corresponds to it. The value of the capacitance obtained is proportional to the surface of the opposing plates and the value of the permittivity of the insulating layer that separates them, and is inversely proportional to the thickness of this insulating layer.

Owing to the invention, there is no relationship of dependency between the integrated circuit suppliers and the contactless object manufacturers. The production costs of the contactless objects are considerably reduced.

The invention claimed is:

1. A contactless portable object comprising:
   terminals of an antenna circuit borne by a substrate, and
   an integrated circuit block comprising:
      an uppermost metal layer defining an active face of the integrated circuit block,
      a first dielectric layer covering only the uppermost metal layer of the integrated circuit block, forming a passivation layer,
      circuit portions located in inner layers below a bottom surface of said passivation layer,
      a first and a second contact pads of the active face of the integrated circuit block, said first and second contact pads being flush with openings of said passivation layer,
      first vias connecting electrically said first and second contact pads to said circuit portions, and
      only two connection plates connected to said terminals of the antenna circuit by capacitive coupling, wherein the first and second connection plates are positioned only above a top surface of the passivation layer, and wherein a surface area of each of said connection plates is substantially greater than a surface area of each of the contact pads, and
      second vias connecting electrically said first and second connection plates to said first and second contact pads, respectively.

2. The object according to claim 1, wherein the connection plates are covered with a second dielectric layer of said integrated circuit.

3. The object according to claim 2, wherein the thickness of the dielectric layer is substantially constant.

4. The object according to claim 1, wherein the length and width of the connection plates is greater than the length and width of the contact pads.

5. The object according to claim 1, wherein the surface of the connection plates is at least four times greater than the surface of the contact pads.

6. The object according to claim 1, wherein each plate covers, at most, two-fifths of the active face of the integrated circuit.

7. The object according to claim 1, wherein the passivation layer has a substantially constant thickness, of between 1 and 7 μm.

8. The object according to claim 1, wherein it is a RFID object.

9. The object according to claim 8, wherein it is a RFID UHF object.

10. An integrated circuit for producing a contactless portable object according to claim 1.

11. The object of claim 1, wherein the surface area of each of the two connection plates is in the order of one-third of the active surface of the integrated circuit.

12. The object of claim 1, wherein the integrated circuit block has a substrate which is cut from a wafer.

13. The object of claim 1, wherein a distance separating the connection plates on the integrated circuit block is from 100 to 300 microns.

14. The object of claim 1, wherein the passivation layer has a substantially constant thickness of between 1 and 7 μm.

15. A process for producing contactless portable objects, comprising:
   providing integrated circuit blocks having inner layers equipped with circuit portions below a bottom surface of a passivation layer covering only an uppermost metal layer of the integrated circuit block, said passivation layer being equipped with openings with which contact pads of the uppermost metal layer of the integrated circuit blocks are flush, said contact pads being electrically connected to said circuit portions by first vias;
   on each of the integrated circuit blocks, positioning only two connection plates, each of the connection plates having a surface area substantially greater than a surface area of each of the contact pads, only above a top surface of the passivation layer, so that said plates are electrically connected to the contact pads by second vias; and
   positioning the integrated circuit blocks on substrates bearing antenna circuits so that the connection plates are arranged opposite terminals of said antenna circuits.

16. The process of claim 15, wherein the integrated circuit block has a substrate which is cut from a wafer.

17. The process of claim 15, wherein a distance separating the connection plates on the integrated circuit block is from 100 to 300 microns.

18. A process for producing contactless portable objects, comprising:
   providing an integrated circuit block comprising:
      an uppermost metal layer defining an active face of the integrated circuit block,
      a first dielectric layer covering only the uppermost metal layer of the integrated circuit block, forming a passivation layer,
      circuit portions located in inner layers below a bottom surface of said passivation layer,
      a first and a second contact pads of the active face of the integrated circuit block, said first and second contact pads being flush with openings of said passivation layer,
      first vias connecting electrically said first and second contact pads to said circuit portions, and
      only two connection plates for connection to terminals of an antenna circuit by capacitive coupling, wherein said first and second connection plates are positioned only above a top surface of the passivation layer, and wherein a surface area of each of said connection plates is substantially greater than a surface area of each of the contact pads, and second vias connecting electrically said first and second connection plates to said first and second contact pads, respectively; and positioning the integrated circuit block on a substrate bearing the antenna circuit so that the connection plates are arranged opposite the terminals of said antenna circuit.

19. The process of claim 18, wherein the integrated circuit block has a substrate which is cut from a wafer.

20. The process of claim 18, wherein a distance separating the connection plates on the integrated circuit block is from 100 to 300 microns.

* * * * *